US012710106B2

(12) United States Patent
Hallberg et al.

(10) Patent No.: US 12,710,106 B2
(45) Date of Patent: Aug. 18, 2026

(54) VENT

(71) Applicant: MAHLE International GmbH, Stuttgart (DE)

(72) Inventors: Torbjorn Hallberg, Valencia (ES); Jaime Sanchez, Massarrojos (ES); Juan Isidro Garcia, Grado (ES)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 19/083,026

(22) Filed: Mar. 18, 2025

(65) Prior Publication Data

US 2025/0297690 A1 Sep. 25, 2025

(30) Foreign Application Priority Data

Mar. 19, 2024 (DE) ......................... 102024107799.9

(51) Int. Cl.
*F16K 24/04* (2006.01)
*H05K 5/02* (2006.01)

(52) U.S. Cl.
CPC ........... *F16K 24/04* (2013.01); *H05K 5/0213* (2013.01)

(58) Field of Classification Search
CPC ....................................................... F16K 24/04
See application file for complete search history.

(56) References Cited

U.S. PATENT DOCUMENTS 6,792,962 B1 * 9/2004 Smith ..................... F16K 24/04 137/12
7,270,146 B1 * 9/2007 Johnston ................ E03C 1/122 137/526
11,796,076 B1 * 10/2023 Clericus ................ F16K 15/148
2002/0090506 A1 7/2002 Protzner
2005/0227610 A1 * 10/2005 Zukor .................... G03B 17/02 454/339
2011/0016836 A1 1/2011 Yano
2014/0137739 A1 5/2014 Ishii
2015/0313034 A1 * 10/2015 Yano .................... H05K 5/0216 428/68

(Continued)

FOREIGN PATENT DOCUMENTS

CN 111022725 A 4/2020
DE 10053681 A1 5/2002
DE 102007012703 A1 6/2008

(Continued)

OTHER PUBLICATIONS

English abstract for CN111022725.

(Continued)

*Primary Examiner* — Umashankar Venkatesan
(74) *Attorney, Agent, or Firm* — Fishman Stewart PLLC

(57) ABSTRACT

A vent for attachment to a housing wall with an aperture may include a body portion, an attachment mechanism via which the vent is attachable to the housing wall, a cover, and an antenna. The body portion may include a wall with an inner surface defining at least part of a central vent passage via which gas is passable through the vent. The cover may be arranged at a first axial end of the body portion covering the central vent passage. At least one opening may be disposed at a first axial end of the body portion for gas to exit the vent. The antenna may be attached to the inner surface of the wall of the body portion.

20 Claims, 4 Drawing Sheets

(56) References Cited

U.S. PATENT DOCUMENTS

2017/0271092 A1* 9/2017 Ishii ...................... H01G 11/80

FOREIGN PATENT DOCUMENTS

| | | | |
|---|---|---|---|
| EP | 3618589 | A1 | 3/2020 |
| JP | 2015181153 | A | 10/2015 |
| WO | 2018183804 | A1 | 10/2018 |
| WO | 2019135399 | A1 | 7/2019 |

OTHER PUBLICATIONS

English abstract for DE102007012703.
German Search Report for DE10 2024 107 799.9, dated Jan. 20, 2025.
EESR, EP25157601.3, dated Aug. 13, 2025.

* cited by examiner

VENT

CROSS-REFERENCE TO RELATED APPLICATION

This application claims priority to German Patent Application No. 102024107799.9, filed on Mar. 19, 2024, the content of which is hereby incorporated by reference in its entirety.

TECHNICAL FIELD

The invention relates to a vent.

BACKGROUND

A vent can be attached to an opening in the housing of various devices, for example electronic control units (ECU's), inverters or converters in order to ensure ventilation of the housing.

A known prior art vent is disclosed in EP3618589. This discloses a support member which is clipped into an aperture in a surface of a housing. The support member has a central opening through which gas can pass. The support member is provided with a cover which clips onto the support member and prevents foreign substances from directly entering the central opening in the axial direction. The vent is further provided with an air-permeable membrane arranged between the cover and the support member. The vent is thus able to block entry of foreign substances, such as dust, water, oil, and salt, into the inside of the housing while ensuring ventilation between inside and outside of the housing.

SUMMARY

The vent according to the invention as defined in the claim(s) improves the options for the arrangement or assembly of electronics within a housing, by providing a vent with multifunctionality.

This is achieved according to the invention with a vent for attachment to a housing wall with an aperture, the vent comprising:

- a body portion comprising a wall with an inner surface defining at least part of a central vent passage for allowing gas to pass through the vent,
- attachment means for attaching the vent to the housing wall,
- a cover arranged at a first axial end of the body portion to cover the central vent passage,
- at least one opening at the first axial end of the body portion for gas to exit the vent,
- wherein an antenna is attached to the inner surface of the wall of the body portion.

Thus, instead of allocating space within the housing of an electronic device for an antenna, the antenna is provided attached to the vent itself. Because the vent can be supplied with the antenna pre-attached, the assembly of an electronic device can be facilitated, as the vent can be easily attached to the housing and only the feed cable of the antenna needs to be connected to the electronic device arranged in the housing.

The inner surface of the wall of the body portion is the surface of the wall portion facing the central vent passage. The axial direction is the direction perpendicular to the housing wall to which the vent is designed to be attached.

The antenna is preferably a printed circuit board (PCB) antenna, wherein the PCB is attached to the inner surface of the wall of the body portion. The term PCB antenna is understood to include flexible circuit board (FCB) antennas. The PCB can be attached to the inner surface of the wall portion by suitable means, for example using adhesive. The PCB antenna is thus located internally in the vent, and is therefore protected against damage during transport and mounting of the vent on a housing.

The antenna is a preferably a WIFI or Bluetooth antenna. Other types of antennae are however also possible.

An antenna feed cable is connected at one end to feed points on the PCB and extends out of the central vent passage at a second axial end of the body portion. When the vent is mounted on a housing wall, the feed cable thus extends into the housing for connection with an electronic device. The feed cable is preferably a coaxial cable.

The attachment means for attaching the vent to a housing wall comprises a plurality of resilient leg portions which extend in the axial direction from the wall, each leg portion comprising a projection or hook at its distal end. The resilient leg portions deform when the vent is axially pressed into the aperture of the housing wall. The leg portions extend through the aperture and the projections or hooks at their distal ends engage with an internal facing surface of the housing wall. The vent can thus be securely attached by simply pressing the vent axially into the aperture of the housing wall.

The vent is provided with a seal, preferably a ring seal, arranged circumferentially around the body portion. The seal forms an airtight seal between the body portion of the vent and the housing wall, when the vent is mounted on the housing wall.

In a preferred embodiment the wall of the body portion has a rectangular shaped cross section defining the central vent passage with a rectangular shaped cross section.

The central vent passage having a rectangular shape facilitates the mounting of a PCB antenna onto the inner surface of the wall of the body portion in the central passage. The PCB can thus be attached to a planar inner surface of the wall of the body portion.

The attachment means can alternatively comprise providing the outer surface of the wall of the body portion with a thread. In this case wall of the body portion has a circular cross section. The thread can either cooperate with an internal thread in the aperture of the housing wall such that the vent can be screwed into the aperture. Alternatively, a nut can be screwed onto the thread such that the housing wall is sandwiched between the nut and the body portion of the vent. In the case that the vent is attached by screw connection the inner surface of the wall of the body portion may be provided with a flat surface extending over the area of the PCB, for ease of attaching the PCB.

The cover of the vent is preferably attached to the body portion via a clip or snap fit connection. The clip or snap connection can be provided by resilient parts of the cover or the body portion which deform when the cover is pressed onto the body portion and lock into a corresponding part of the cover or body portion each other's movement when in a specific relative position. In one embodiment the cover is provided with a plurality of resilient arms which extend in the axial direction from the cover. The arms have projections or hook at their distal ends which engage in the attached position with the body portion in a locking manner.

In one embodiment the first axial end of the body portion comprises a flange which extends from the wall perpendicularly to the axial direction, wherein a layer of filter material is arranged between the cover and the body portion. The layer of filter material is for example an air-permeable membrane. The membrane can be partly supported by the flange of the body portion.

The cover prevents foreign substances from entering in the axial direction directly into the passage, and together with the body portion, defines lateral vent openings for gas to pass through the vent. The body portion can comprise an end wall at the first axial end of the body portion, whereby the end wall can be provided with a plurality of openings. This end wall can serve as a further support for the filter material. Alternatively, a support lattice can be provided on the body portion, providing support for the filter material whilst permitting gas to pass in and out of the central vent passage. The cover may also comprise at least one projection extending in the axial direction towards the central vent passage for securely fixing the filter material against the body portion and, at the same time, permitting gas to flow across the surface of the filter material.

The body portion and the cover are preferably made out of a plastic material.

BRIEF DESCRIPTION OF THE DRAWINGS

Embodiments will now be described by way of example only with reference to the accompanying drawings, in which.

DETAILED DESCRIPTION

Figure 1:
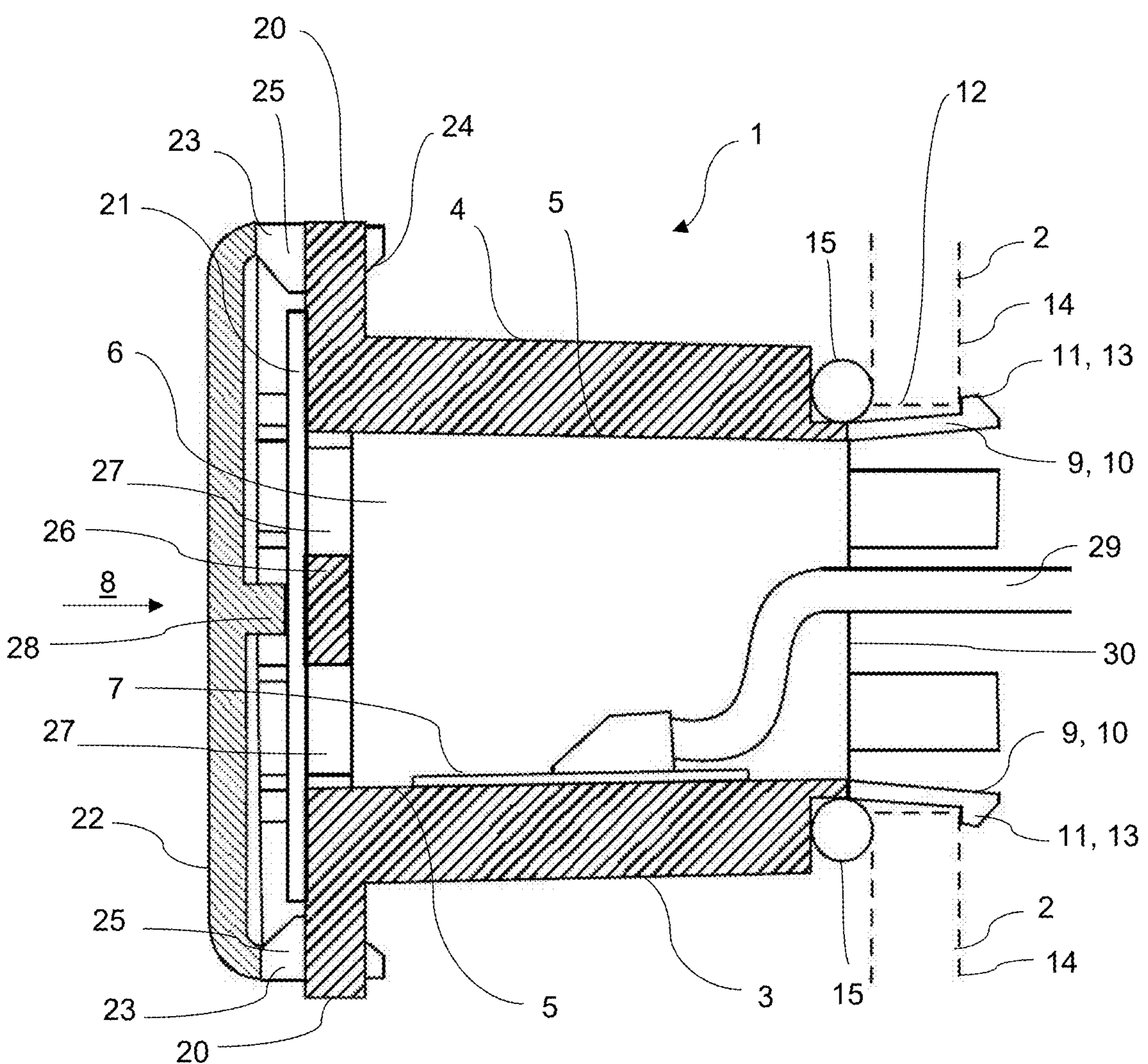
FIG. 1 is a cross section view of a vent according to one embodiment the invention.
Figure 2:
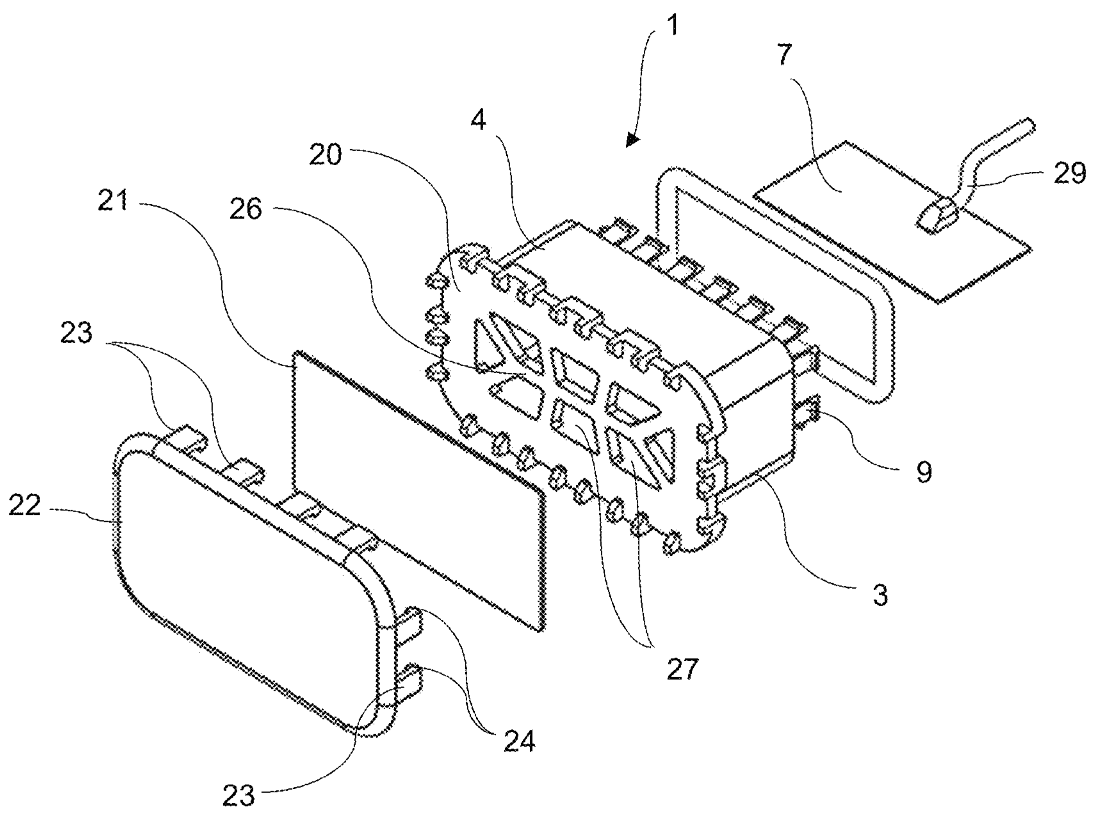
FIG. 2 is an exploded view of a vent according to the invention.
Figure 3:
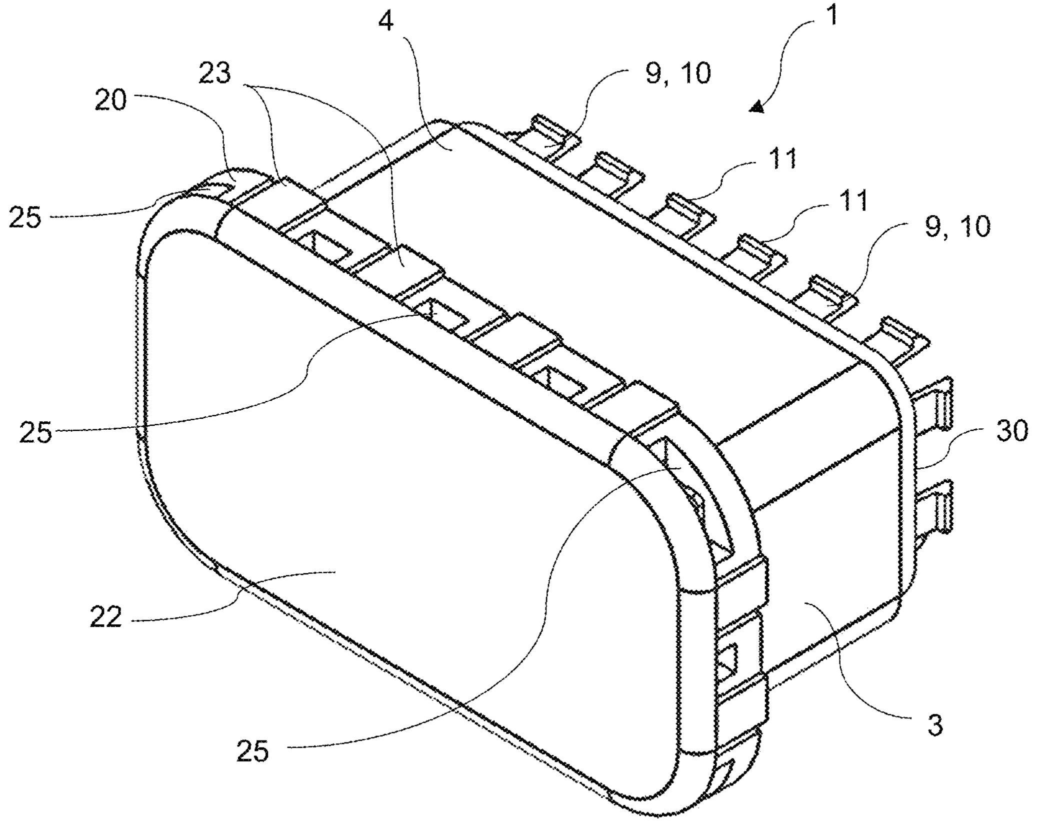
FIG. 3 is a perspective view of a vent according to the invention.

FIGS. 1 to 3 show a vent 1 according to a first embodiment of the invention. The vent 1 may be attached to a housing of an electronic device. Part of the housing wall 2 is indicated in the figures with a dashed line. The electronic device can be, for example, an inverter or converter, or onboard charger, which may require communication means for communicating with other components or control units.

The vent 1 comprises a body portion 3 having an axially extending wall 4 with an inner surface 5 defining at least part of a central vent passage 6 for allowing gas to pass through the vent 1. The vent passage 6 extends in the axial direction 8, which is perpendicular to the wall 2 of the housing of the electronic device.

According to the invention an antenna 7 is attached to the inner surface 5 of the wall 4 of the body portion 3. The antenna is a preferably a WIFI or Bluetooth antenna 7. Other types of antennae 7 are however also possible. In the embodiment shown the antenna 7 is a printed circuit board (PCB) antenna, wherein the PCB is attached to the inner surface of the wall 4 of the body portion 3. The term PCB antenna is understood to include flexible circuit board (FCB) antennas. The PCB can be attached to the inner surface of the wall 4 by any suitable means, for example using adhesive or clips. As the PCB antenna 7 is located internally in the vent 1, it is protected against damage during transport and during mounting of the vent on a housing wall 2.

The housing of an electronic device therefore doesn't need to allocate space for an internal antenna. The antenna 7 is instead provided attached to the vent 1 itself. Because the vent 1 can be supplied with the antenna 7 pre-attached, the assembly of an electronic device is facilitated, as the vent 1 can be easily attached to the housing and only the feed cable 29 of the antenna 7 needs to be connected to the electronic device arranged in the housing. The antenna feed cable 29 is connected at one end to feed points on the PCB antenna 7 and extends out of the central vent passage 6 at a second axial end 30 of the body portion 3. When the vent 1 is mounted on a housing wall 2, the feed cable 29 thus extends into the housing for connection with an electronic device. The feed cable is a coaxial cable.

The vent 1 further comprises attachment means 9 for attaching the vent to the housing wall 2. In one embodiment shown in FIGS. 1 to 3 the attachment means 9 comprises a plurality of resilient leg portions 10 which extend in the axial direction 8 from the wall 4 of the body portion 3, each leg portion 10 comprising a projection 11 or hook at its distal end 13. The resilient leg portions 10 deform when the vent 1 is axially pressed into an aperture 12 of the housing wall 2. The leg portions 10 extend through the aperture 12 and the projections 11 or hooks at their distal ends 13 engage with an internal facing surface 14 of the housing wall 2. The vent 1 can thus be securely attached to the housing wall 2 by simply pressing the vent 1 axially into the aperture 12 of the housing wall 2. A ring seal 15 is arranged circumferentially around the body portion 3. The seal 15 forms an airtight seal between the body portion 3 of the vent 1 and the housing wall 2, when the vent 1 is mounted on the housing wall. The seal 15 abuts against an axially facing end face of the wall 4, and radially surrounds the leg portions 10 or an axially extending lip provided on the wall 4.

The wall 4 of the body portion 3 has a rectangular shaped cross section defining the central vent passage 6 with a rectangular shaped cross section. The rectangular shape facilitates the mounting of the PCB antenna 7 onto the inner surface 5 of the wall 4 of the body portion 3 in the central passage 6. The PCB can thus be attached to a planar inner surface 5 of the wall of the body portion 3. The aperture 12 in the housing wall 2 is also rectangular shaped. It would however also be possible to make the vent 1 having a body portion 3 with a circular cross section for insertion into a circular aperture 12 in a housing wall 2.

Figure 4:
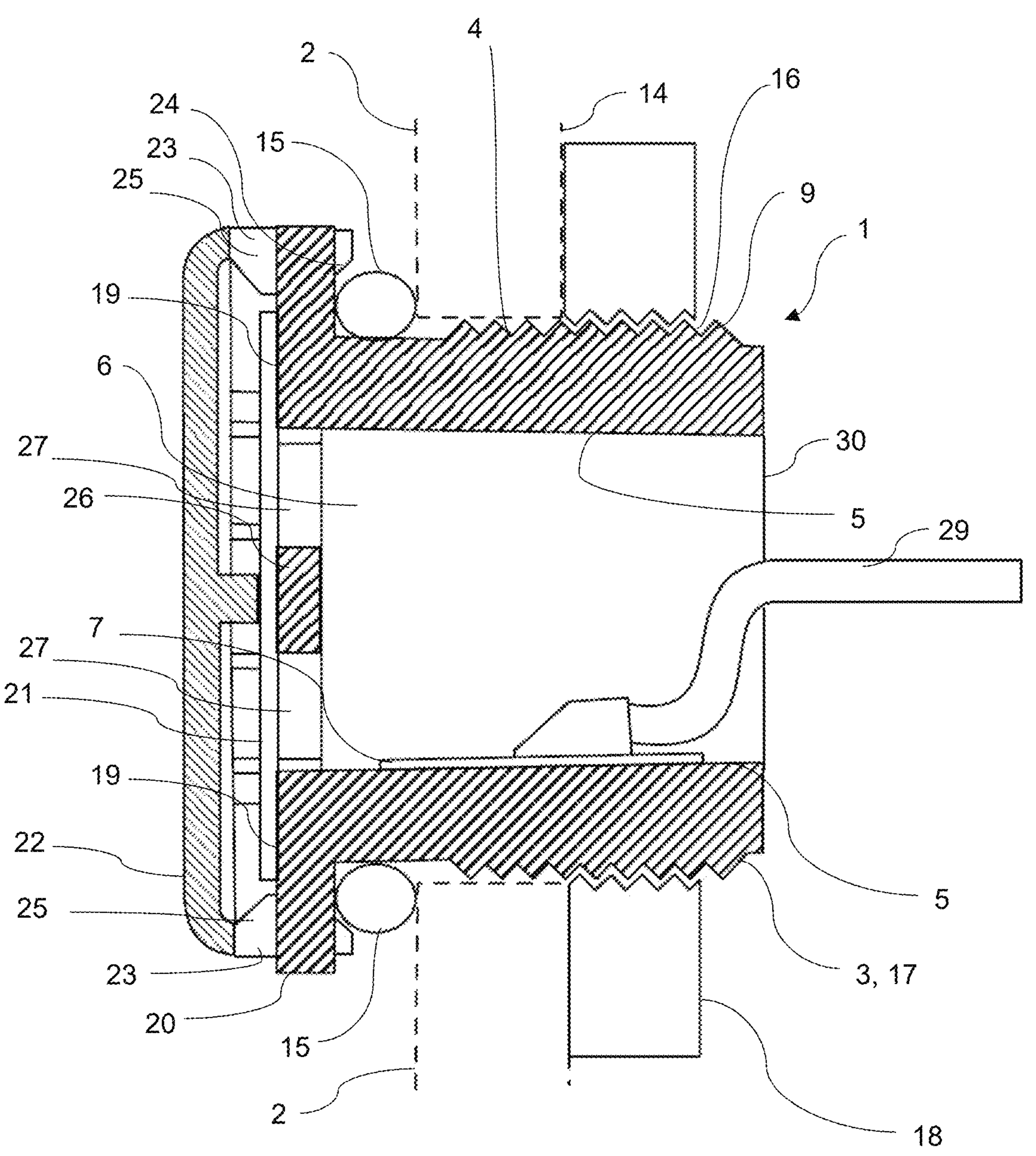
FIG. 4 is a cross section view of a vent according to a further embodiment the invention.

FIG. 4 shows a vent 1 with alternative attachment means 9 for attaching the vent 1 to the housing wall 2. The outer surface 16 of the wall 14 of the body portion 3 is provided with a thread 17. In this case wall 4 of the body portion 3 has a circular cross section. The thread 17 can either cooperate with an internal thread in the aperture of the housing wall 2 such that the vent can be screwed into the aperture 12. Alternatively, a nut 18 can be screwed onto the thread 17 such that the housing wall 2 is sandwiched between the nut 18 and the body portion 3 of the vent 1. In the case that the vent 1 is attached by screw connection the inner surface of the wall of the body portion may be provided with a flat surface 5 extending over the area of the PCB, for ease of attaching the PCB.

A cover 22 is arranged at a first axial end 19 of the body portion 3 to cover the central vent passage 6. The cover 22 of the vent 1 is preferably attached to the body portion 3 via a clip or snap fit connection. The clip or snap connection is provided by resilient parts 23 of the cover 22 or the body portion 3 which deform when the cover 22 is pressed onto the body portion and lock into a corresponding part of the cover or body portion when in a specific relative position. In the embodiments shown, the cover 22 is provided with a plurality of resilient arms 23 which extend in the axial direction 8 from the cover 22. The resilient arms 23 are distributed around the periphery of the cover 22 and have a projection 24 or hook at their distal ends which engage in the attached position with the body portion 3 in a locking manner. The cover 22 in the embodiment in FIGS. 1 to 3 has a rectangular shape, whereas the cover 22 in the embodiment in FIG. 4 has a circular shape.

In the embodiments shown in FIGS. 1 to 4 the first axial end 19 of the body portion 3 comprises a flange 20 which extends from the wall 4 perpendicularly to the axial direction 8. The projections 24 of the resilient arms 23 are arranged to engage with the flange 20 in a locked position. In the embodiment shown in FIG. 4, the seal 15 abuts against an axially facing surface of the flange 20 and is sandwiched between the flange 20 and the housing wall 2 when the vent is attached to the housing wall 2.

A layer of filter material 21 is arranged between the cover 22 and the body portion 3. The layer of filter material 21 is for example a gas-permeable membrane, for letting gas pass through the vent 1 and preventing water or foreign particles or substances from passing through the vent 1. The membrane 21 can be partly supported by the flange 20 of the body portion 3. The cover 22 together with the body portion 3, further define lateral vent openings 25 for gas to pass through the vent 1 past the cover 22. The body portion 3 comprises an end wall 26 at the first axial end 19 of the body portion 3, whereby the end wall 26 is provided with a plurality of openings 27. This end wall 26 serves as a further support for the filter material 21. Alternatively, a support lattice can be provided integrally or as a separate part on the body portion 3, providing support for the filter material 21 whilst permitting gas to pass in and out of the central vent passage 6. The cover 22 also comprises at least one projection 28 extending in the axial direction 8 towards the central vent passage 6 for securely fixing the filter material 21 against the body portion 3 and, at the same time, permitting gas to flow across the surface of the filter material 21. The filter material 21 is sandwiched between the at least one projection 28 of the cover and the end wall 26 of the body portion 3. The body portion 3 and the cover 22 of the vent are made out of a plastic material.

The invention claimed is:

1. A vent for attachment to a housing wall with an aperture, the vent comprising:
- a body portion including a wall with an inner surface defining at least part of a central vent passage via which gas is passable through the vent;
- an attachment mechanism via which the vent is attachable to the housing wall;
- a cover arranged at a first axial end of the body portion covering the central vent passage;
- at least one opening disposed at a first axial end of the body portion for gas to exit the vent; and
- an antenna attached to the inner surface of the wall of the body portion.

2. The vent according to claim 1, wherein:
- the antenna is a printed circuit board (PCB) antenna including a printed circuit board (PCB); and
- the PCB is attached to the inner surface of the wall of the body portion.

3. The vent according to claim 2, further comprising an antenna feed cable connected at one end to a plurality of feed points of the PCB and extending out of the central vent passage at a second axial end of the body portion.

4. The vent according to claim 2, wherein the inner surface of the wall of the body portion has a flat surface extending over an area of the PCB.

5. The vent according to claim 1, wherein the antenna is a WIFI antenna and/or a Bluetooth antenna.

6. The vent according to claim 1, wherein the attachment mechanism includes a plurality of resilient leg portions extending in an axial direction from the wall, each leg portion of the plurality of leg portions including a distal end and a hook or a projection disposed at the distal end.

7. The vent according to claim 6, wherein the wall of the body portion defines the central vent passage with a rectangular shaped cross section.

8. The vent according to claim 6, further comprising a seal arranged on an axially facing surface of the wall of the body portion and extending around the plurality of resilient legs in a circumferential direction.

9. The vent according to claim 8, wherein the seal is arranged radially outside of the plurality of leg portions.

10. The vent according to claim 1, wherein the attachment mechanism includes a thread disposed on an outer surface of the wall of the body portion.

11. The vent according to claim 10, further comprising a seal, wherein:
- the body portion further includes a flange extending from the wall perpendicularly to an axial direction; and
- the seal is arranged on the outer surface of the wall axially between the flange and the thread.

12. The vent according to claim 11, further comprising a layer of filter material arranged between the cover and the flange, wherein the layer of filter material is a gas-permeable membrane.

13. The vent according to claim 1, wherein the cover is attached to the body portion via a snap fit connection.

14. The vent according to claim 13, wherein the cover includes a plurality of resilient arms extending in an axial direction from the cover, each arm of the plurality of arms including a distal end and a hook or a projection disposed at the distal end.

15. The vent according to claim 14, wherein the plurality of arms are arranged around an outer periphery of the cover.

16. The vent according to claim 1, further comprising a layer of filter material arranged between the cover and the body portion, wherein the body portion further includes a flange extending from the wall perpendicularly to an axial direction.

17. The vent according to claim 1, further comprising a layer of filter material arranged at the first axial end of the body portion and covering an axial end of the central vent passage.

18. The vent according to claim 17, wherein:
- the body portion further includes an end wall disposed at the first axial end; and
- the layer of filter material is arranged on the end wall.

19. The vent according to claim 18, wherein the end wall of the body portion is structured as a support lattice defining a plurality of openings.

20. The vent according to claim 18, wherein:
- the cover includes at least one projection extending axially toward the central vent passage; and
- the layer of filter material is sandwiched between the at least one projection of the cover and the end wall of the body portion.

* * * * *